US006738946B1

(12) United States Patent
Irvin

(10) Patent No.: US 6,738,946 B1
(45) Date of Patent: May 18, 2004

(54) METHODS, COMMUNICATION DEVICES, AND COMPUTER PROGRAM PRODUCTS FOR COMMUNICATING INFORMATION VIA A FRAME CHECK SEQUENCE HAVING AN INFORMATION BLOCK ASSOCIATED THEREWITH

(75) Inventor: David R. Irvin, Raleigh, NC (US)

(73) Assignee: Telefonaktiebolaget L.M. Ericsson, Stockholm (SE)

( * ) Notice: Subject to any disclaimer, the term of this patent is extended or adjusted under 35 U.S.C. 154(b) by 481 days.

(21) Appl. No.: 09/634,031

(22) Filed: Aug. 8, 2000

(51) Int. Cl.[7] ............................................. H03M 13/00
(52) U.S. Cl. ...................... 714/776; 714/752
(58) Field of Search ................ 714/755, 807, 714/758, 757, 776, 752, 712, 774, 746, 751, 786, 781, 766; 709/236; 375/139; 370/466

(56) References Cited

U.S. PATENT DOCUMENTS

| | | | | |
|---|---|---|---|---|
| 4,827,477 A | * | 5/1989 | Avaneas ...................... | 714/757 |
| 4,926,415 A | * | 5/1990 | Tawara et al. ............... | 370/231 |
| 5,121,396 A | | 6/1992 | Irvin et al. ..................... | 371/53 |
| 5,142,539 A | | 8/1992 | Dahlin et al. ............... | 371/37.1 |
| 5,432,800 A | * | 7/1995 | Kuroda et al. ............... | 714/758 |
| 5,694,407 A | * | 12/1997 | Glaise ......................... | 714/807 |
| 5,862,160 A | | 1/1999 | Irvin et al. ..................... | 371/53 |
| 5,875,211 A | | 2/1999 | Cooper ......................... | 375/213 |
| 5,930,367 A | | 7/1999 | Osawa et al. | |
| 6,396,866 B1 | * | 5/2002 | Upton et al. ................. | 375/139 |

OTHER PUBLICATIONS

Stephen Wicker, Error Control Systems for Digital Communications and Storage, 1995 Prentice–Hall Inc., pp. 99–128.*

Irvin, *Preserving the Integrity of Cyclic–Redundancy Checks When Protected Text is Intentionally Altered*, IBM Journal of Research and Development, vol. 33, No. 6, Nov. 1989, pp. 618–626.

IBM Technical Disclosure Bulletin, *Technique for Cyclic Redundancy Check Modification Useful in Certain Data Networks*, vol. 37, No. 06B, pp. 267–271 (Jun. 1994).

International Search Report for International Application Ser. No. PCT/US01/21850 dated Dec. 27, 2002.

* cited by examiner

Primary Examiner—Christine T. Tu
Assistant Examiner—Mujtaba Chaudry
(74) Attorney, Agent, or Firm—Myers Bigel Sibley & Sajovec, P.A.

(57) ABSTRACT

Embodiments of methods, communication devices, communication systems, and computer program products may facilitate communication of information via a frame-check sequence that has an information block associated therewith. For example, one or more information blocks may be provided and respectively associated with one or more information block frame-check sequences. A message for transmission may be provided and a message frame-check sequence may be computed based on the message. One of the information blocks may also be selected for transmission along with the message. Rather than constructing a packet that includes both the selected information block and the message, however, the information block frame-check sequence that is associated with the selected information block is added to the message frame-check sequence to compute a transmit frame-check sequence. A packet comprising the message and the transmit frame-check sequence may then be transmitted. Once received, the packet may be divided by a generator polynomial to determine whether any remainder results. If the remainder is non-zero, then a determination may be made whether remainder corresponds to any of the one or more information block frame-check sequences. If the remainder does correspond to one of the information block frame-check sequences, then the information block associated with the information block frame-check sequence that corresponds to the remainder may be processed as received information.

32 Claims, 6 Drawing Sheets

| MESSAGE I(x) | FCS R(x) |

| MESSAGE I(x) | FCS (R(x) + $r_i(x)$) |

Phantom Information Block Frame Check Sequences $r_i(x)$

Phantom Information Block $P_i(x)$

| | |
|---|---|
| 0000 | 0 |
| 0001 | FCS for $X^{160}$ |
| 0010 | FCS for $X^{161}$ |
| 0011 | FCS for $X^{160} + X^{161}$ |
| ● | ● |
| ● | ● |
| 1111 | FCS for $X^{160} + X^{161} + X^{162} + X^{163}$ |

FIG. 5

Bit Position Frame Check Sequences $r_{bp}(x)$

Non-zero Bit Positions For Phantom Information Block $P_i(x)$

| | |
|---|---|
| 0001 | FCS for $X^{160}$ |
| 0010 | FCS for $X^{161}$ |
| 0100 | FCS for $X^{162}$ |
| 1000 | FCS for $X^{163}$ |

FIG. 8

METHODS, COMMUNICATION DEVICES, AND COMPUTER PROGRAM PRODUCTS FOR COMMUNICATING INFORMATION VIA A FRAME CHECK SEQUENCE HAVING AN INFORMATION BLOCK ASSOCIATED THEREWITH

BACKGROUND OF THE INVENTION

The present invention relates generally to the field of packet communication, and, more particularly, to using a packet frame-check sequence (FCS) to convey information.

A common error detection technique that may be used in packet communication networks is known cyclic redundancy check (CRC). This technique may be explained as follows: Given a k-bit frame or message, a transmitter generates an n-bit sequence, known as a frame-check sequence (FCS), so that the resulting packet, consisting of k+n, bits is exactly divisible by some predetermined number. A receiver then divides the incoming packet by the same number and, if there is no remainder, assumes that there was no error.

Principles of the basic CRC algorithm may be expressed mathematically as follows: Let I(x) by a polynomial representing the message to be transmitted and let G(x) be a generating polynomial of degree n for the CRC algorithm. Typically, I(x) is multiplied by $x^n$ to left shift the message to make room for the n-bit FCS, which is denoted by R(x), at the low order of the packet. The relationship between I(x), G(x), and R(x) may expressed as set forth in Equation 1:

$$(x^n)I(x)=Q(x)G(x)+R(x), \qquad \text{EQ. 1}$$

where Q(x) is the quotient that results from dividing $(x^n)I(x)$ by G(x). The product Q(x)G(x) may be added to both sides of Equation 1, which yields Equation 2 below:

$$R(x)=(x^n)I(x)+Q(x)G(x). \qquad \text{EQ. 2}$$

Note that Q(x)G(x)+Q(x)G(x) equals zero as any binary number added to itself is zero for the case of finite field coefficients. Equation 2, however, may be rewritten as a statement of congruence as set forth in Equation 3:

$$R(x)=(x^n)I(x) \bmod G(x). \qquad \text{EQ. 3}$$

Thus, the FCS R(x) is given by the remainder that results from the division of the left shifted message polynomial $(x^n)I(x)$ by the generator polynomial G(x).

Conventional packet communication systems have used the FCS to convey information, such as an address or "color code." A color code may be a code used to identify packets that are intended for multiple receiving stations. In this regard, a first group of receiving stations may accept packets encoded using a first color code, a second group of receiving stations may accept packets encoded using a second color code, etc. A transmitting station may append an address or color code to the high-order end of a message to create an extended message. The CRC algorithm may then be used to compute the FCS for the extended message. The FCS may be appended to the low-order end of the extended message to prepare the extended message for transmission. Before transmitting the extended message, however, the address or color code is removed from the high-order end of the extended message leaving the original message and the FCS computed for the extended message. A packet comprising the original message the FCS computed for the extended message may then be transmitted to one or more receiving stations.

Upon receipt of the packet at a receiving station, the receiving station may append its own address or accepted color code at the high-order end of the packet. The receiving station may then use the CRC algorithm to determine if the packet is in congruence with the CRC generator polynomial. If the packet is in congruence with the CRC generator polynomial, then the receiving station may presume that the transmitting station has addressed or color coded the packet for it. On the other hand, if the packet is not in congruence with the CRC generator polynomial, then the receiving station may presume that the transmitting station has addressed or color coded the packet for another receiving station or that the packet has been corrupted with a channel error. In this case, the packet may be discarded. Alternatively, conventional receiving stations may compute the FCS for the packet after appending their own address or accepted color code at the high-order end of the packet. If the computed FCS matches the FCS transmitted with the packet, then a receiving station may accept the packet, otherwise, the receiving station may discard the packet. In this manner, a packet may carry address or color code information for the packet implicitly in the FCS without increasing the size of the message field or adding one or more new information fields to the packet.

SUMMARY OF THE INVENTION

According to embodiments of the present invention, methods, communication devices, communication systems, and computer program products may be provided for communicating information via a frame-check sequence having an information block associated therewith. For example, one or more information blocks may be provided and respectively associated with one or more information block frame-check sequences. A message for transmission may be provided and a message frame-check sequence may be computed based on the message. One of the information blocks may also be selected for transmission along with the message. Rather than constructing a packet that includes both the selected information block and the message, however, the information block frame-check sequence that is associated with the selected information block is added to the message frame-check sequence to compute a transmit frame-check sequence. A packet comprising the message and the transmit frame-check sequence may then be transmitted.

In accordance with further embodiments of the present invention, the associations between the one or more information blocks and the one or more information block frame-check sequences are also provided at a receiver where the packet is received. Once received, the packet may be divided by a generator polynomial to determine whether any remainder results. If the remainder is non-zero, then a determination may be made whether remainder corresponds to any of the one or more information block frame-check sequences. If the remainder does correspond to one of the information block frame-check sequences, then the information block associated with the information block frame-check sequence that corresponds to the remainder may be processed as received information.

The present invention takes advantage of the principles of linearity and superposition inherent in the basic cyclic redundancy check (CRC) algorithm. Advantageously, the frame-check sequence for an information block may be added to the frame-check sequence for a message to thereby encode the information block into the packet. When the packet is received, a CRC operation may be performed, which results in a remainder corresponding to the frame check sequence for the encoded information block. Associations may be developed a priori between the one or more information blocks and their frame check sequences. Moreover, these associations may be stored, for example, in a data structure, such as a table. The remainder may thus be used to index the table and recover the encoded information block.

In accordance with further embodiments of the present invention, if dividing a received packet by the generator polynomial does not result in any remainder, then the receiver may presume that an information block has not been encoded in the packet and, therefore, only the message is processed as received information. Thus, broadcast packets (i.e., packets that are not specifically addressed or color coded) may be received and processed after performing a single CRC operation.

The present invention may decode packets from an information stream that includes both broadcast packets and packets that are addressed or color coded for specific receivers without performing multiple CRC analysis operations. That is, as discussed hereinabove, if dividing a received packet by the generator polynomial results in a non-zero remainder, then that remainder may be used, for example, to index a data structure in which information blocks are associated with frame check sequences. By determining which, if any, of the one or more information block frame check sequences corresponds to the remainder, the associated information block may be recovered from the data structure and processed as received information without the need to append a prospective information block to the received packet and perform an additional CRC analysis.

In accordance with still further embodiments of the present invention, a received packet may be discarded if dividing the received packet by the generator polynomial results in a remainder, but the remainder does not correspond to any of the one or more information block frame check sequences. In this case, a receiver may presume that the received packet has been corrupted with a communication channel error.

In accordance with other embodiments of the present invention, each of the one or more information blocks may be represented by a K-bit field where K>0. Moreover, each of the one or more information blocks may be associated with their respective information block frame check sequences by determining, for each bit position in the K-bit field, if any of the one or more information blocks contain a nonzero bit in that specific bit position. If at least one of the one or more information blocks contains a non-zero bit in a specific one of the K bit positions, then a bit position frame check sequence may be computed for that specific bit position (i.e., a one in that specific bit position and zeros in the other K−1 bit positions).

In accordance with still other embodiments of the present invention, the information block frame check sequence corresponding to the selected information block may be constructed by selecting the bit position frame check sequences corresponding to non-zero bit positions in the selected information block and then adding these selected bit position frame check sequences together to compute the information block frame check sequence. By exploiting the linearity and superposition principles of the basic CRC algorithm, the present invention may use a data structure with at most K bit position frame check sequences stored therein to compute the information block frame check sequences. This data structure may consume substantially less memory than the memory that may otherwise be needed to store an information block frame check sequence for every possible information block.

Although the present invention has been described above primarily with respect to method aspects of the invention, it will be understood that the present invention may be embodied as methods, communication devices, communication systems, and computer program products.

BRIEF DESCRIPTION OF THE DRAWINGS

Other features of the present invention will be more readily understood from the following detailed description of specific embodiments thereof when read in conjunction with the accompanying drawings, in which:

FIG. 5 is a data structure diagram that illustrates associations between information blocks and information block frame check sequences in embodiments of methods, communication devices, communication systems, and computer program products in accordance with the present invention; and FIG. 8 is a data structure diagram that illustrates associations between information blocks and bit position frame check sequences in embodiments of methods, communication devices, communication systems, and computer program products in accordance with the present invention.

DETAILED DESCRIPTION OF PREFERRED EMBODIMENTS

Figure 1:
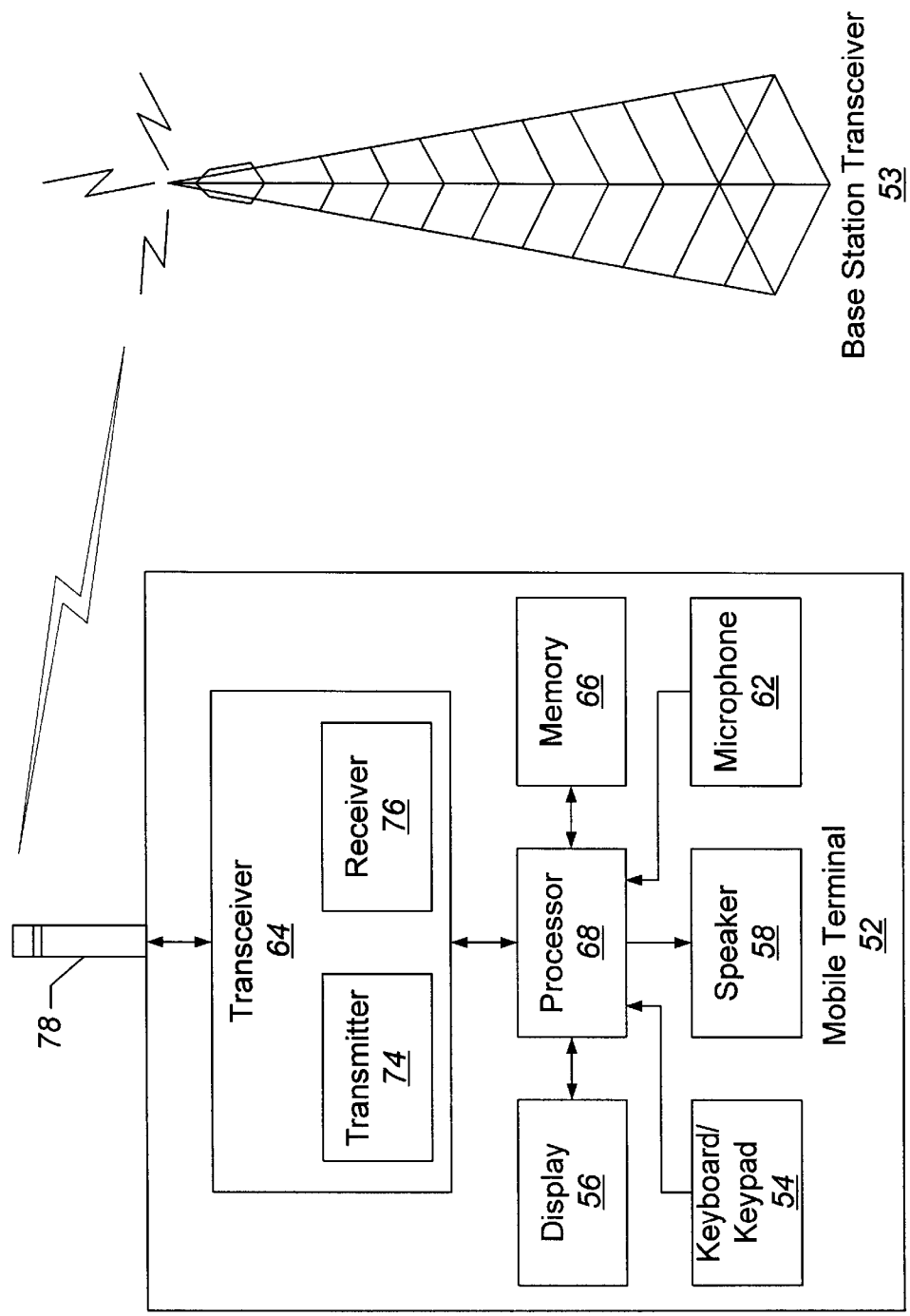
FIG. 1 is a high-level diagram of an exemplary radiotelephone communication system that illustrates embodiments of methods, communication devices, communication systems, and computer program products in accordance with the present invention.

While the invention is susceptible to various modifications and alternative forms, specific embodiments thereof are shown by way of example in the drawings and will herein be described in detail. It should be understood, however, that there is no intent to limit the invention to the particular forms disclosed, but on the contrary, the invention is to cover all modifications, equivalents, and alternatives falling within the spirit and scope of the invention as defined by the claims. Like reference numbers signify like elements throughout the description of the figures.

The present invention is described herein in the context of processing a packet.

It will be understood that the term "packet" means a unit of information that may be transmitted electronically as a whole from one device to another. Accordingly, as used herein, the term "packet" may encompass such terms of art as "frame" or "message," which may also be used to refer to a unit of transmission.

The present invention may be embodied as methods, communication devices, communication systems, and/or computer program products. Accordingly, the present invention may be embodied in hardware and/or in software (including firmware, resident software, micro-code, etc.). Furthermore, the present invention may take the form of a computer program product on a computer-usable or computer-readable storage medium having computer-usable or computer-readable program code embodied in the medium for use by or in connection with an instruction execution system. In the context of this document, a computer-usable or computer-readable medium may be any medium that can contain, store, communicate, propagate, or transport the program for use by or in connection with the instruction execution system, apparatus, or device.

The computer-usable or computer-readable medium may be, for example but not limited to, an electronic, magnetic, optical, electromagnetic, infrared, or semiconductor system, apparatus, device, or propagation medium. More specific examples (a nonexhaustive list) of the computer-readable medium would include the following: an electrical connection having one or more wires, a portable computer diskette, a random access memory (RAM), a read-only memory (ROM), an erasable programmable read-only memory (EPROM or Flash memory), an optical fiber, and a portable compact disc read-only memory (CD-ROM). Note that the computer-usable or computer-readable medium could even be paper or another suitable medium upon which the program is printed, as the program can be electronically captured, via, for instance, optical scanning of the paper or other medium, then compiled, interpreted, or otherwise processed in a suitable manner, if necessary, and then stored in a computer memory.

Referring now to FIG. 1, exemplary communication systems for communicating information via a frame-check sequence (FCS) having an information block associated therewith may include a mobile terminal 52 and a base station transceiver 53. The mobile terminal 52 may include a keyboard/keypad 54, a display 56, a speaker 58, a microphone 62, a transceiver 64, and a memory 66 that communicate with a processor 68. The transceiver 64 typically comprises a transmitter circuit 74 and a receiver circuit 76, which respectively transmit outgoing radio frequency signals to the base station transceiver 53 and receive incoming radio frequency signals from the base station transceiver 53 via an antenna 78. The radio frequency signals transmitted between the mobile terminal 52 and the base station transceiver 53 may comprise both traffic and control signals (e.g., paging signals/messages for incoming calls), which are used to establish and maintain communication with another party or destination. The foregoing components of the mobile terminal 52 may be included in many conventional mobile terminals and their functionality is generally known to those skilled in the art. The base station transceiver 53 contains the radio transceivers that define an individual cell in a cellular network and communicate with the mobile terminal 52 and other mobile terminals in the cell using a radio-link protocol.

It will be understood that although the present invention may be embodied in communication devices or systems, such as the mobile terminal 52 and/or the base station transceiver 53, the present invention is not limited to such devices and/or systems. Instead, the present invention may be embodied in any method, communication device, communication system, or computer program product that facilitates communication of information via packets and uses the basic cyclic redundancy check (CRC) algorithm.

Figures 2, 4, 6:
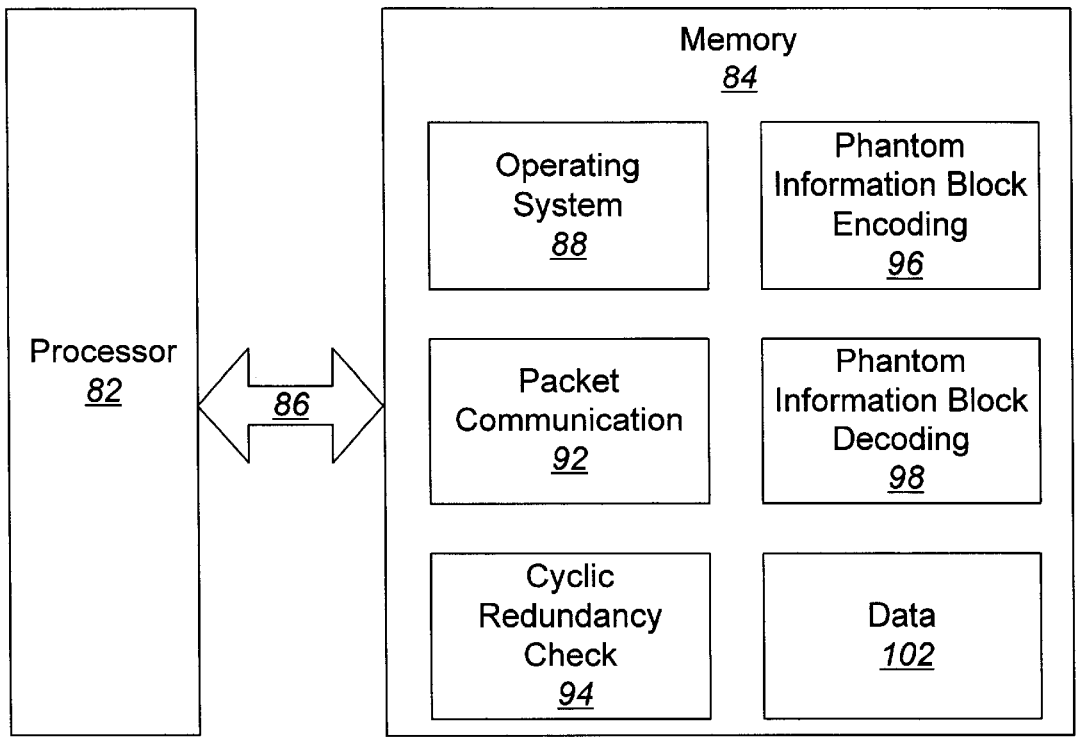
FIG. 2 is a block diagram that illustrates a processor and memory that may be used in embodiments of methods, communication devices, communication systems, and computer program products for communicating information via a frame-check sequence having an information block associated therewith.
FIGS. 4 and 6 are block diagrams that illustrate constructions of packets at various stages in embodiments of methods, communication devices, communication systems, and computer program products in accordance with the present invention.

FIG. 2 illustrates a processor 82 and a memory 84, that may be used in embodiments of methods, communication devices, communication systems, and computer program products for communicating information via a frame-check sequence having an information block associated therewith in accordance with the present invention. The processor 82 communicates with the memory 84 via an address/data bus 86. The processor 82 may be, for example, a commercially available or custom microprocessor. The memory 84 is representative of the overall hierarchy of memory devices containing the software and data used to implement the functionality of a communication device or system, such as the mobile terminal 52 or base station transceiver 53 of FIG. 1. The memory 84 may include, but is not limited to, the following types of devices: cache, ROM, PROM, EPROM, EEPROM, flash, SRAM, and DRAM.

As shown in FIG. 2, the memory 84 may hold six major categories of software and data: the operating system 88; the packet communication program module 92; the cyclic redundancy check (CRC) module 94; the phantom information block encoding module 96; the phantom information block decoding module 98; and the data module 102. The operating system 88 controls the operation of the communication device or communication system software, including managing software resources and coordinating execution of programs. Preferably, the operating system 88 is designed for real-time communication applications.

The packet communication module 92 may be configured to implement a packet communication protocol and may cooperate with the CRC module 94 to protect the integrity of data packets during transmission over a communication channel. The CRC module 94 may be configured to implement basic CRC algorithms and procedures, which are commonly used to detect errors in packet communication systems as discussed hereinabove. The basic CRC algorithms are based on linear mathematical algorithms; therefore, the present invention may exploit the principle of superposition, which is inherent in a linear algorithm.

The phantom information block encoding module 96 may be configured to encode a packet with an information block by using a frame-check sequence that is associated with the information block. Conversely, the phantom information block decoding module 98 may be configured to decode a packet that has been encoded by the phantom information block encoding module 96. Operations of both the phantom information block encoding module 96 and the phantom information block decoding module 98 will be described in detail hereinafter. It should be understood that, in accordance with the present invention, a communication device or system may not be configured with both the phantom information block encoding module 96 and the phantom information block decoding module 98. For example, if a communication device or system is limited to performing only as a transmitter, then the communication device or system may be configured with only the phantom information block encoding module 96 as there would not be a need to decode a received packet. On the other hand, if a communication device or system is limited to performing only as a receiver, then the communication device or system may be configured with only the phantom information block decoding module 98 as there would not be a need to encode a packet for transmission.

Finally, the data module 102 represents both the static and dynamic data used by the software modules in the memory 84 to carry out their operations. In particular, the data module 102 may include a data structure that associates one or more information blocks with respective frame-check sequences.

Although FIG. 2 illustrates an exemplary software architecture that may facilitate communication of information via a frame-check sequence that has an information block associated therewith, it will be understood that the present invention is not limited to such a configuration but is intended to encompass any configuration capable of carrying out operations described herein.

Computer program code for carrying out operations of the respective program modules may be written in a high-level programming language, such as C or C++, for development convenience. Nevertheless, some modules or routines may be written in assembly language or even micro-code to enhance performance and/or memory usage. It will be further appreciated that the functionality of any or all of the program modules may also be implemented using discrete hardware components, a single application specific integrated circuit (ASIC), or a programmed digital signal processor or microcontroller.

The present invention is described hereinafter with reference to flowchart and/or block diagram illustrations of methods, systems, and computer program products in accordance with exemplary embodiments of the invention. It will be understood that each block of the flowchart and/or block diagram illustrations, and combinations of blocks in the flowchart and/or block diagram illustrations, may be implemented by computer program instructions. These computer program instructions may be provided to a processor of a general purpose computer, a special purpose computer, or other programmable data processing apparatus to produce a machine, such that the instructions, which execute via the processor of the computer or other programmable data processing apparatus, create means for implementing the functions specified in the flowchart and/or block diagram block or blocks.

These computer program instructions may also be stored in a computer usable or computer-readable memory that may direct a computer or other programmable data processing apparatus to function in a particular manner, such that the instructions stored in the computer usable or computer-readable memory produce an article of manufacture including instructions that implement the function specified in the flowchart and/or block diagram block or blocks.

The computer program instructions may also be loaded onto a computer or other programmable data processing apparatus to cause a series of operational steps to be performed on the computer or other programmable apparatus to produce a computer implemented process such that the instructions that execute on the computer or other programmable apparatus provide steps for implementing the functions specified in the flowchart and/or block diagram block or blocks.

Figure 3:
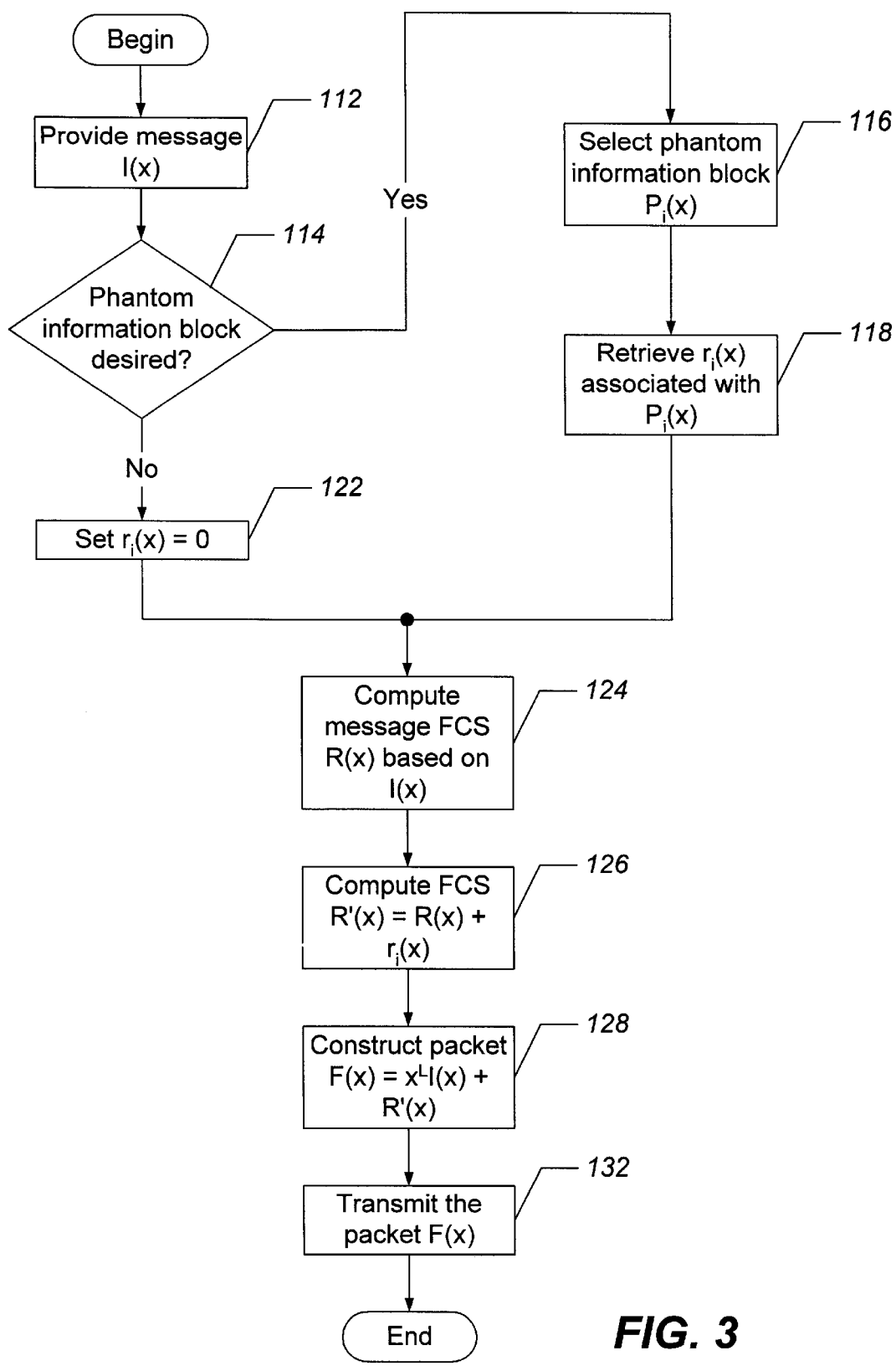
FIGS. 3, 7, and 9 are flowcharts that illustrate exemplary operations of methods, communication devices, communication systems, and computer program products for communicating information via a frame-check sequence having an information block associated therewith in accordance with embodiments of the present invention.

With reference to the flowcharts of FIGS. 3, 7, and 9, exemplary operations of methods, communication devices, communication systems, and computer program products for communicating information via a frame-check sequence having an information block associated therewith, in accordance with embodiments of the present invention, will be described hereafter. Referring now to FIG. 3, exemplary operations for transmitting information, in accordance with the present invention, begin at block 112 where a transmitter is provided with a message, which may be described by a polynomial I(x) of degree N-1 and having modulo-2 coefficients. At block 114, the phantom information block encoding module 96 determines whether a phantom information block is to be implicitly transmitted with the message I(x). A phantom information block may be represented as a K-bit field. Accordingly, a set of phantom information blocks may be described as a set of $2^K$ polynomials $P_i(x)$ i=0 to $2^K-1$ of degree K-1 and having modulo-2 coefficients. In accordance with the present invention, a phantom information block $P_i(x)$ may be implicitly transmitted from a transmitter to a receiver through a packet frame-check sequence without the need to append the phantom information block $P_i(x)$ to the packet. Hence, the information blocks may be termed "phantom" information blocks.

As shown in FIG. 4, the message may have a corresponding frame-check sequence that is computed by the CRC module 94 and appended to the low order bits of the message. The frame-check sequence for the message I(x) may be described by a polynomial R(x) of degree L-1 and having modulo-2 coefficients (i.e., the length of the frame-check sequence for the message is L bits). The generator polynomial used by the CRC module 94 to generate the frame-check sequence R(x) for the message I(x) may be described by a polynomial G(x) of degree L and having modulo-2 coefficients.

In accordance with the present invention, a frame-check sequence may be determined for each of the phantom information blocks $P_i(x)$ i=0 to $2^K-1$ and stored, for example, as a table in non-volatile memory. This association between the phantom information blocks $P_i(x)$ i=0 to $2^k-1$ and their corresponding frame-check sequences may be illustrated by way of example. Suppose that G(x) is a degree 32 polynomial (i.e., L=32), the message I(x) comprises a 128-bit field (i.e., N=128), and the phantom information blocks $P_i(x)$ i=0 to $2^K-1$ comprise a 4-bit field (i.e., K=4). Thus, the phantom information blocks $P_i(x)$ i=0 to $2^K-1$ comprise a set of sixteen bit patterns ranging from bit pattern 0000 to bit pattern 1111. The frame-check sequences for the phantom information blocks $P_i(x)$ i=0 to $2^K-1$ may be computed by shifting the phantom information blocks $P_i(x)$ i=0 to $2^K-1$ to the high order end of the message I(x) and using the CRC module 94 to compute the frame-check sequence. These operations may be represented mathematically as Equation 4 set forth below:

$$r_i(x)=x^{L+N}P_i(x)[\text{modulo } G(x)] \text{ for } i=0 \text{ to } 2^{K-1} \qquad \text{EQ. 4}$$

where $r_i(x)$ is the frame-check sequence for the phantom information block $P_i(x)$.

As illustrated in FIG. 5, a data structure may be used in which phantom information block frame check sequences $r_i(x)$ i=0 to $2^K-1$ are associated with the phantom information blocks $P_i(x)$ i=0 to $2^K-1$ This data structure may be a table, as shown in FIG. 5, or another suitable data structure and may be stored in non-volatile memory where it may be accessed by the phantom information block encoding module 96. The exemplary table illustrated in FIG. 5 is populated based on the foregoing example of a 4-bit phantom information field, 128-bit message field, and a 32-bit frame-check sequence for the message. Thus, the frame-check sequence for phantom information block $P_{15}(x)$ may be obtained using Equation 4 as follows:

$$r_{15}(x)=x^{32+128}P_{15}(x)[\text{modulo } G(x)]$$

$$r_{15}(x)=(x^{160})(x^3+x^2+x+1)[\text{modulo } G(x)]$$

$$r_{15}(x)=x^{163}+x^{162}+x^{161}+x^{160}[\text{modulo } G(x)]$$

It will be appreciated, however, that due to the linearity of the basic CRC algorithm, the phantom information blocks $P_i(x)$ i=0 to $2^K-1$ need not be shifted to the high order end of the message I(x) for implicit transmission. In accordance with the present invention, the phantom information blocks $P_i(x)$ i=0 to $2^K-1$ may alternatively be superimposed over the message I(x). For example, a phantom information block $P_i(x)$ may be superimposed over the low order four bits of the third octet of the message I(x) by shifting the phantom information block $P_i(x)$ by 16 bits instead of 128 bits when computing the frame check sequence $r_i(x)$ that is associated with the phantom information block $P_i(x)$. That is, Equation 4 may be replaced with Equation 5 as set forth below:

$$r_i(x)=x^{L+16}P_i(x)[\text{modulo } G(x)] \text{ for } i=0 \text{ to } 2^K-1 \qquad \text{EQ. 5}$$

Returning to FIG. 3, if the phantom information block encoding module 96 determines that a phantom information block $P_i(x)$ is to be implicitly transmitted with the message at block 114, then the phantom information block encoding module 96 selects the desired phantom information block $P_i(x)$ at block 116. Next, the phantom information block encoding module 96 retrieves the frame-check sequence that is associated with the selected phantom information block $P_i(x)$ at block 118. This operation may be performed, for example, by using the selected phantom information block $P_i(x)$ to index a table, such as the table shown in FIG. 5, to obtain the frame-check sequence $r_i(x)$ that is associated with the selected phantom information block $P_i(x)$. If, however, the phantom information block encoding module 96 determines that no phantom information block is to be implicitly transmitted with the message at block 114, then the phantom information encoding module 96 sets the phantom information block frame-check sequence to zero at block 122.

Operations continue at block 124 where the CRC module 94 computes the frame check sequence R(x) for the message I(x) using the basic CRC algorithm. The phantom information block encoding module 96 may then compute a transmit frame-check sequence R'(x) by adding the phantom information block frame-check sequence $r_i(x)$ to the message frame check sequence R(x) at block 126. Because of the principles of linearity and superposition that are inherent in the basic CRC algorithm, the phantom information block frame-check sequence $r_i(x)$ may be recovered from the transmit frame-check sequence R'(x) at a receiver, which may in turn allow the phantom information block $P_i(x)$ to be recovered. Recall that if no phantom information block is to be transmitted in this packet, then the phantom information block frame-check sequence is set to zero at block 122, which results in the transmit frame-check sequence R'(x) being equal to the message frame-check sequence R(x).

The packet may be constructed for transmission at block 128 as illustrated in FIG. 6 with the message I(x) left shifted L bits to accommodate the transmit frame check sequence R'(x). The packet may be described by a polynomial F(x) of degree L+N-1 and having modulo-2 coefficients. Finally, at block 132, the packet may be transmitted to a receiving communication device.

Figure 7:
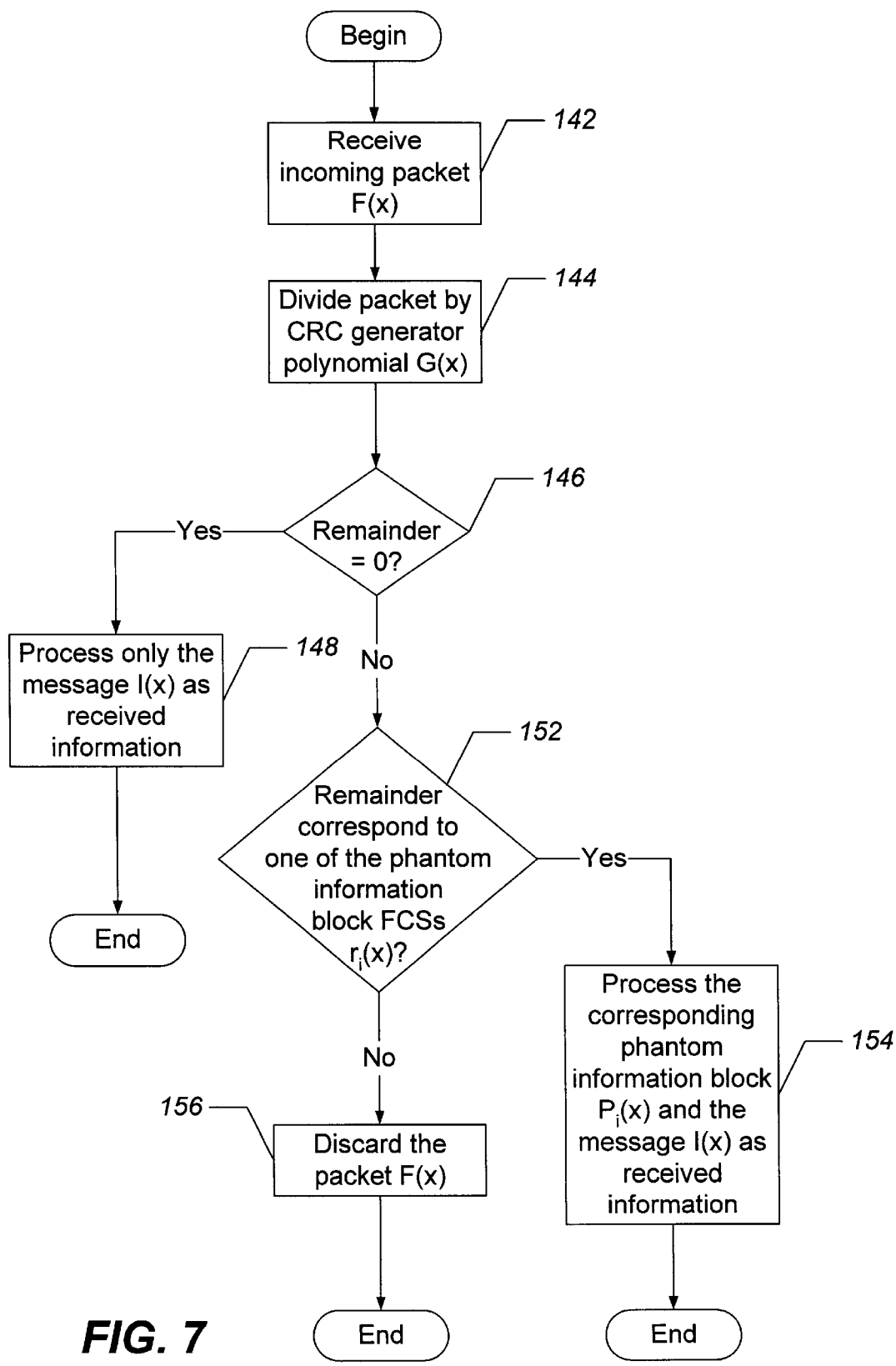

Referring now to FIG. 7, exemplary operations for receiving information, in accordance with the present invention, begin at block 142 where a receiver receives the incoming packet F(x) at block 142. At block 144, the CRC module 94 may perform a CRC analysis on the received packet by dividing the packet by the CRC generator polynomial G(x). The phantom information block decoding module 98 may then process the remainder of the CRC analysis at block 146 to determine whether the remainder is non-zero.

If the remainder is zero as determined at block 146, then the phantom information block decoding module 98 may presume that the packet has been transmitted without having a phantom information block $P_i(x)$ encoded therein. In this case, the phantom information block decoding module 98 may process only the message I(x) portion of the packet as received information at block 148. Thus, broadcast packets (i.e., packets that are not specifically addressed or color coded) may be received and processed after performing a single CRC operation.

If, however, the remainder is non-zero as determined at block 146, then the phantom information block decoding module 98 may determine whether the remainder corresponds to one of the phantom information block frame-check sequences $r_i(x)$ i=0 to $2^K-1$ at block 152. In accordance with the present invention, the associations between the phantom information blocks $P_i(x)$ i=0 to $2^K-1$ and the frame-check sequences $r_i(x)$ i=0 to $2^K-1$ that are provided at a transmitting communication device or system are also provided at a receiving communication device or system. For example, the same data structure used to associate the phantom information block frame check sequences $r_i(x)$ i=0 to $2^K-1$ with the phantom information blocks $P_i(x)$ i=0 to $2^K-1$ may be stored in non-volatile memory at both a transmitter and at a receiver.

Thus, the phantom information block decoding module 98 may, for example, use the remainder to index the data structure containing the associations between the phantom information blocks $P_i(x)$ i=0 to $2^K-1$ and the frame-check sequences $r_i(x)$ i=0 to $2^K-1$ to recover the phantom information block $P_i(x)$ that is associated with a frame-check sequence $r_i(x)$ corresponding to the remainder. If the packet F(x) was transmitted with a phantom information block encoded into the transmit frame-check sequence R'(x), then, assuming no communication channel errors have been incurred, the remainder will correspond to the frame-check sequence $r_i(x)$ associated with the encoded phantom information block $P_i(x)$ due to the linearity of the CRC algorithm. This aspect of the present invention may be shown mathematically as follows: An incoming packet encoded with a phantom information block is given by $F(x)=x^L I(x)+R(x)+r_i(x)$. But R(x) is computed such that the following expression holds: $x^L I(x)+R(x)=Q(x)G(x)$. Therefore, $F(x)=Q(x)G(x)+r_i(x)$ and the remainder upon dividing the incoming packet by the generator polynomial G(x) is $r_i(x)$, which is the frame-check sequence associated with the encoded phantom information block $P_i(x)$.

Returning to FIG. 3, if the remainder corresponds to one of the phantom information block frame check sequences $r_i(x)$ i=0 to $2^K-1$ at block 152, then the phantom information block decoding module 98 may use the remainder to index the data structure containing the associations between the phantom information blocks $P_i(x)$ i=0 to $2^K-1$ and the frame-check sequences $r_i(x)$ i=0 to $2^K-1$ to recover the phantom information block $P_i(x)$. The phantom information block $P_i(x)$ and the message I(x) may then be processed as received information at block 154. Note that the phantom information block $P_i(x)$ may represent an address, a color code, or any other type of information that a transmitter desires to send to a receiver implicitly through the frame-check sequence. Advantageously, the present invention may allow recovery of the phantom information block $P_i(x)$ from the received packet F(x) without having to extend the packet by appending an address, color code, or other information thereto and then perform a subsequent CRC analysis. As a result, processor real-time may be conserved.

If, however, the remainder does not correspond to one of the phantom information block frame check sequences $r_i(x)$ i=0 to $2^K-1$ at block 152, then the phantom information block decoding module 98 may presume that the packet has been corrupted by a communication channel error and the packet may be discarded at block 156.

From the foregoing it can readily be seen that, in accordance with the present invention, information may be implicitly communicated from a transmitter to a receiver using a frame-check sequence $r_i(x)$ that has a phantom information block $P_i(x)$ associated therewith. In particular, a receiver may decode the phantom information block frame-check sequence $r_i(x)$ from a received packet and then use the phantom information block frame-check sequence $r_i(x)$ to traverse, for example, a locally accessible data structure that contains an association between the phantom information block $P_i(x)$ and the decoded phantom information block frame-check sequence $r_i(x)$.

In accordance with various alternative embodiments of the present invention, one or more phantom information blocks $P_i(x)$ i=0 to $2^K-1$ may be defined for communication between a transmitter and a receiver. As discussed hereinabove, a K-bit phantom information field may be used to define $2^K$ phantom information blocks. For large values of K, it may not be desirable to store all possible phantom information blocks $P_i(x)$ i=0 to $2^K-1$ and their associated frame-check sequences $r_i(x)$ i=0 to $2^K-1$ n a data structure because of the memory that may be required, particularly if only a subset of the phantom information blocks $P_i(x)$ i=0 to $2^K-1$ will be used in communication. In accordance with the present invention, only those phantom information blocks and their associated frame-check sequences may be stored in a data structure that may be used at both the transmitter and the receiver.

Referring now to FIG. 8, alternative embodiments of the present invention may be used to reduce the memory that may be required to maintain the associations between the phantom information blocks and their respective frame-check sequences at a transmitting communication device.

Specifically, frame check sequences may be associated with data blocks corresponding to the phantom information blocks $P_i(x)$ i=0 to $2^K-1$ that have only a single non-zero bit. Accordingly, these frame-check sequences may be termed bit position frame-check sequences $r_{bp}(x)$. This aspect of the present invention may be illustrated by way of example. As shown in FIG. 8, a data structure is populated based on the example phantom information blocks $P_i(x)$ i=0 to $2^K-1$, message I(x), and generator polynomial G(x) discussed hereinabove with respect to FIG. 5. In contrast to the data structure of FIG. 5, however, the data structure of FIG. 8 associates a bit position frame-check sequence $r_{bp}(x)$ with each of four data blocks corresponding to the four possible non-zero bit positions of the phantom information block field.

Note that if not all of the possible phantom information blocks $P_i(x)$ i=0 to $2^K-1$ may be used in communication, then it may be desirable to determine which bit positions carry non-zero data in those phantom information blocks $P_i(x)$ i=0 to $2^K-1$ that are to be used for communication. Then, the data structure may be populated to associate bit position frame-check sequences $r_{bp}(x)$ with only those data blocks corresponding to the non-zero bit positions of the phantom information blocks $P_i(x)$ i=0 to $2^{K-1}$ that are to be used for communication. For example, as shown in FIG. 8, if the phantom information blocks 0010, 0100, and 0110 are used for communication, then the data structure need not include associations for the 0001 and 1000 data blocks.

Figure 9:
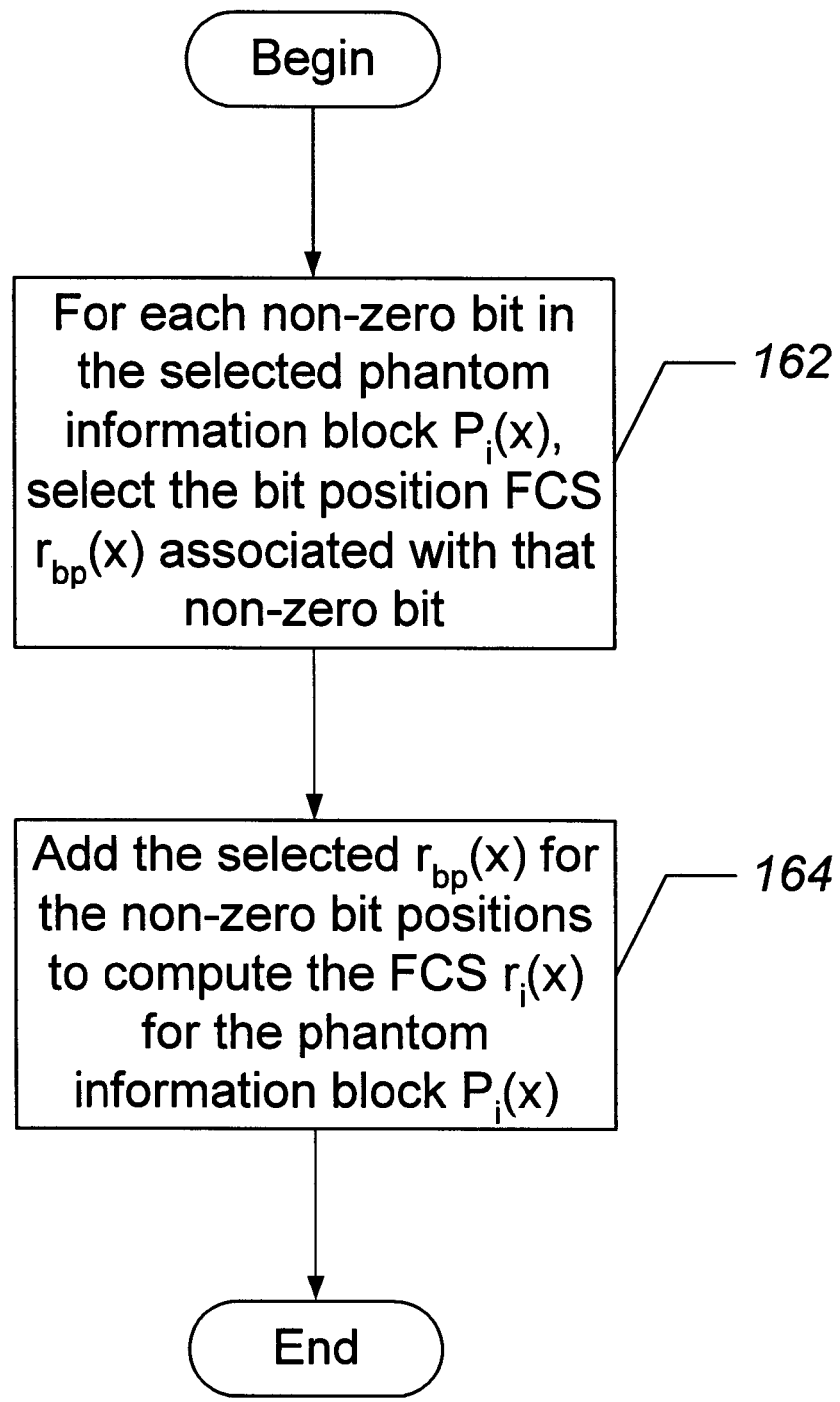

With reference to FIG. 9, exemplary operations for generating the phantom information block frame-check sequence $R_i(x)$ for a selected phantom information block $P_i(x)$ at a transmitter will be described. Operations begin at block 162 where, for each non-zero bit in the selected phantom information block $P_i(x)$, the phantom information block encoding module 96 may select the bit position frame-check sequence $r_{bp}(x)$ that is associated with that non-zero bit. Next, at block 164, the phantom information block encoding module 96 may add the selected bit position frame-check sequences $r_{bp}(x)$ to compute the frame-check sequence $r_i(x)$ associated with the selected phantom information block $P_i(x)$. As discussed hereinabove, the present invention exploits the principles of linearity and superposition of the basic CRC algorithm. That is, if Z=A+B+C then the frame-check sequence for Z is equal to the frame-check sequence for A plus the frame-check sequence for B plus the frame check sequence for C. Because any phantom information block $P_i(x)$ i=0 to $2^K-1$ may be decomposed into a sum of data blocks that each contain a single, non-zero bit, it therefore follows that the frame-check sequence $r_i(x)$ for a phantom information block $P_i(x)$ may be computed by summing the bit position frame check sequences $r_{bp}(x)$ of which the phantom information block $P_i(x)$ is composed.

In concluding the detailed description, it should be noted that many variations and modifications can be made to the preferred embodiments without substantially departing from the principles of the present invention. All such variations and modifications are intended to be included herein within the scope of the present invention, as set forth in the following claims.

I claim:

1. A method of transmitting information, comprising the steps of:

providing a plurality of information blocks;

associating each of the plurality of information blocks with a respective information block frame-check sequence;

providing a message;

computing a message frame-check sequence based on the message;

selecting one of the plurality of information blocks;

adding the information block frame-check sequence that is associated with the selected information block to the message frame-check sequence to compute a transmit frame-check sequence; and transmitting a packet that comprises the message and the transmit frame-check sequence without the selected one of the plurality of information blocks.

2. A method as recited in claim 1, wherein each of the plurality of information blocks comprises K-bits, such that K>0.

3. A method as recited in claim 2, wherein the step of associating each of the plurality of information blocks with the respective information block frame-check sequence comprises the steps of:

for a respective one of the K bit positions, determining if any of the plurality of information blocks contains a non-zero bit in the respective one of the K bit positions; and computing a bit position frame-check sequence for the respective one of the K bit positions if at least one of the plurality of information blocks contains a non-zero bit in the respective one of the K bit positions.

4. A method as recited in claim 3, wherein the step of adding the information block frame-check sequence that is associated with the selected information block to the message frame-check sequence to compute the transmit frame-check sequence comprises the steps of:

for each respective non-zero bit of the selected information block, selecting the respective bit position frame-check sequence computed for that respective one of the K bit positions; and adding any selected bit position frame-check sequence together to compute the information block frame-check sequence that is associated with the selected information block.

5. A method of receiving information, comprising the steps of:

providing a plurality of information blocks;

associating each of the plurality of information blocks with a respective information block frame-check sequence;

receiving a packet that comprises a message and a frame-check sequence without one of the plurality of information blocks;

dividing the packet by a generator polynomial to determine if a non-zero remainder results;

determining if the remainder corresponds to one of the plurality of information block frame-check sequences if dividing the packet by the generator polynomial results in a non-zero remainder; and processing the information block that is associated with the information block frame-check sequence that corresponds to the remainder as received information if the remainder is determined to correspond to one of the plurality of information block frame-check sequences.

6. A method as recited in claim 5, further comprising the step of:

processing only the message as received information if dividing the packet by the generator polynomial results in a remainder of zero.

7. A method as recited in claim 5, further comprising the step of:

discarding the packet if dividing the packet by the generator polynomial results in a remainder that does not correspond to any of the plurality of information block frame-check sequences.

8. A communication device, comprising:
- a storage medium having a data structure stored therein in which each of a plurality of information blocks is associated with a respective information block frame-check sequence;
- a processor that is in communication with the storage medium and is configured to receive a message, to compute a message frame-check sequence based on the message, to select one of the plurality of information blocks, and to add the information block frame-check sequence that is associated with the selected information block to the message frame-check sequence to compute a transmit frame-check sequence; and
- a transmitter that is configured to transmit a packet that comprises the message and the transmit sequence without the selected one of the plurality of information blocks.

9. A communication device as recited in claim 8, wherein each of the plurality of information blocks comprises K-bits, such that K>0.

10. A communication device as recited in claim 9, wherein the data structure contains a bit position frame-check sequence for a respective one of the K bit positions for which at least one of the plurality of information blocks contains a non-zero bit in the respective one of the K bit positions.

11. A communication device as recited in claim 10, wherein the processor is further configured, for each respective non-zero bit of the selected information block, to select the respective bit position frame-check sequence corresponding to that respective one of the K bit positions, and to add any selected bit position frame-check sequence together to compute the information block frame-check sequence that is associated with the selected information block.

12. A communication device as recited in claim 8, wherein the communication device is a mobile terminal.

13. A communication device as recited in claim 8, wherein the communication device is a base station transceiver.

14. A communication device, comprising:
- a storage medium having a data structure stored therein in which each of a plurality of information blocks is associated with a respective information block frame-check sequence;
- a receiver that is configured to receive a packet that comprises a message with a frame-check sequence appended thereto without one of the plurality of information blocks; and
- a processor that is in communication with the storage medium and is configured to divide the packet by a generator polynomial to determine if a non-zero remainder results, to determine if the remainder corresponds to one of the plurality of information block frame-check sequences if dividing the packet by the generator polynomial results in a non-zero remainder, and to process the information block that is associated with the information block frame-check sequence that corresponds to the remainder as received information if the remainder is determined to correspond to one of the plurality of information block frame-check sequences.

15. A communication device as recited in claim 14, wherein the processor is further configured to process only the message as received information if dividing the packet by the generator polynomial results in a remainder of zero.

16. A communication device as recited in claim 14, wherein the processor is further configured to discard the packet if dividing the packet by the generator polynomial results in a non-zero remainder that does not correspond to any of the plurality of information block frame-check sequences.

17. A communication device as recited in claim 14, wherein the communication device is a mobile terminal.

18. A communication device as recited in claim 14, wherein the communication device is a base station transceiver.

19. A system for transmitting information, comprising:
- means for providing a plurality of information blocks;
- means for associating each of the plurality of information blocks with a respective information block frame-check sequence;
- means for providing a message;
- means for computing a message frame-check sequence based on the message;
- means for selecting one of the plurality of information blocks;
- means for adding the information block frame-check sequence that is associated with the selected information block to the message frame-check sequence to compute a transmit frame-check sequence; and
- means for transmitting a packet that comprises the message and the transmit frame-check sequence without the selected one of the plurality of information blocks.

20. A system as recited in claim 19, wherein each of the plurality of information blocks comprises K-bits, such that K>0.

21. A system as recited in claim 20, wherein the means for associating each of the plurality of information blocks with the respective information block frame-check sequence comprises:
- for a respective one of the K bit positions, means for determining if any of the plurality of information blocks contains a non-zero bit in the respective one of the K bit positions; and
- means for computing a bit position frame-check sequence for the respective one of the K bit positions if at least one of the plurality of information blocks contains a non-zero bit in the respective one of the K bit positions.

22. A system as recited in claim 21, wherein the means for adding the information block frame-check sequence that is associated with the selected information block to the message frame-check sequence to compute the transmit frame-check sequence comprises:
- for each respective non-zero bit of the selected information block, means for selecting the respective bit position frame-check sequence computed for that respective one of the K bit positions; and
- means for adding any selected bit position frame-check sequence together to compute the information block frame-check sequence that is associated with the selected information block.

23. A system for receiving information, comprising:
- means for providing a plurality of information blocks;
- means for associating each of the plurality of information blocks with a respective information block frame-check sequence;
- means for receiving a packet that comprises a message and a frame-check sequence without one of the plurality of information blocks;
- means for dividing the packet by a generator polynomial to determine if a non-zero remainder results;
- means for determining if the remainder corresponds to one of the plurality of information block frame-check sequences if dividing the packet by the generator polynomial results in a non-zero remainder; and
- means for processing the information block that is associated with the information block frame-check sequence that corresponds to the remainder as received information if the remainder is determined to correspond to one of the plurality of information block frame-check sequences.

24. A system as recited in claim 23, further comprising:

means for processing only the message as received information if dividing the packet by the generator polynomial results in a remainder of zero.

25. A system as recited in claim 23, further comprising:

means for discarding the packet if dividing the packet by the generator polynomial results in a remainder that does not correspond to any of the plurality of information block frame-check sequences.

26. A computer program product for transmitting information, comprising:

a computer readable program medium having computer readable program code embodied therein, the computer readable program code comprising:

computer readable program code for providing a plurality of information blocks;

computer readable program code for associating each of the plurality of information blocks with a respective information block frame-check sequence;

computer readable program code for providing a message;

computer readable program code for computing a message frame-check sequence based on the message;

computer readable program code for selecting one of the plurality of information blocks;

computer readable program code for adding the information block frame-check sequence that is associated with the selected information block to the message frame-check sequence to compute a transmit frame-check sequence; and computer readable program code for transmitting a packet that comprises the message and the transmit frame-check sequence without the selected one of the plurality of information blocks.

27. A computer program product as recited in claim 26, wherein each of the plurality of information blocks comprises K-bits, such that K>0.

28. A computer program product as recited in claim 27, wherein the computer readable program code for associating each of the plurality of information blocks with the respective information block frame-check sequence comprises:

for a respective one of the K bit positions, computer readable program code for determining if any of the plurality of information blocks contains a non-zero bit in the respective one of the K bit positions; and computer readable program code for computing a bit position frame-check sequence for the respective one of the K bit positions if at least one of the plurality of information blocks contains a non-zero bit in the respective one of the K bit positions.

29. A computer program product as recited in claim 28, wherein the computer readable program code for adding the information block frame-check sequence that is associated with the selected information block to the message frame-check sequence to compute the transmit frame-check sequence comprises:

for each respective non-zero bit of the selected information block, computer readable program code for selecting the respective bit position frame-check sequence computed for that respective one of the K bit positions; and computer readable program code for adding any selected bit position frame-check sequence together to compute the information block frame-check sequence that is associated with the selected information block.

30. A computer program product for receiving information, comprising:

a computer readable program medium having computer readable program code embodied therein, the computer readable program code comprising:

computer readable program code for providing a plurality of information blocks;

computer readable program code for associating each of the plurality of information blocks with a respective information block frame-check sequence;

computer readable program code for receiving a packet that comprises a message and a frame-check sequence without one of the plurality of information blocks;

computer readable program code for dividing the packet by a generator polynomial to computer readable program code for determining if the remainder corresponds to one of the plurality of information block frame-check sequences if dividing the packet by the generator polynomial results in a non-zero remainder; and computer readable program code for processing the information block that is associated with the information block frame-check sequence that corresponds to the remainder as received information if the remainder is determined to correspond to one of the plurality of information block frame-check sequences.

31. A computer program product as recited in claim 30, further comprising:

computer readable program code for processing only the message as received information if dividing the packet by the generator polynomial results in a remainder of zero.

32. A computer program product as recited in claim 30, further comprising:

computer readable program code for discarding the packet if dividing the packet by the generator polynomial results in a remainder that does not correspond to any of the plurality of information block frame-check sequences.

* * * * *